(12) United States Patent
Vilhonen et al.

(10) Patent No.: US 8,451,157 B2
(45) Date of Patent: May 28, 2013

(54) DOUBLE BALANCED DIGITAL TRANSMITTER

(75) Inventors: Sami Vilhonen, Lieto (FI); Rami Tapani Eskola, Turku (FI)

(73) Assignee: ST-Ericsson SA, Plan-les-Ouates (CH)

( * ) Notice: Subject to any disclaimer, the term of this patent is extended or adjusted under 35 U.S.C. 154(b) by 160 days.

(21) Appl. No.: 13/076,717

(22) Filed: Mar. 31, 2011

(65) Prior Publication Data

US 2011/0210881 A1 Sep. 1, 2011

Related U.S. Application Data

(63) Continuation-in-part of application No. PCT/EP2009/067812, filed on Dec. 22, 2009.

(51) Int. Cl.
*H03M 1/66* (2006.01)

(52) U.S. Cl.
USPC ............................ 341/144; 375/297; 375/298

(58) Field of Classification Search
USPC .................. 341/144, 153; 375/296, 297, 299, 375/260, 298; 455/562.1
See application file for complete search history.

(56) References Cited

U.S. PATENT DOCUMENTS

| | | | |
|---|---|---|---|
| 5,856,799 A | 1/1999 | Hamasaki et al. | |
| 6,278,731 B1 * | 8/2001 | Galperin | 375/229 |
| 6,690,313 B1 | 2/2004 | Warren et al. | |
| 7,418,056 B2 * | 8/2008 | Suzuki et al. | 375/296 |
| 7,583,754 B2 * | 9/2009 | Liu | 375/297 |
| 7,830,982 B2 * | 11/2010 | Mesecher | 375/299 |
| 7,853,293 B2 * | 12/2010 | Doi | 455/562.1 |
| 7,907,671 B2 * | 3/2011 | Klomsdorf et al. | 375/260 |
| 2008/0285676 A1 | 11/2008 | Goussin et al. | |

OTHER PUBLICATIONS

You, S., et al., A Switched-Capacitor Power Amplifier for EER/Plar Transmitters, IEEE International Solid-State Circuits Conference, 2011, pp. 428-430.
Borremans, J., et al., A 40nm CMOS Highly Linear 0.4-to-6GHz Receiver Resilient to 0dBm Out-of-Band Blockers, IEEE International Solid-State Circuits Conference, 2011, pp. 62-64.

* cited by examiner

*Primary Examiner* — Peguy Jean Pierre
(74) *Attorney, Agent, or Firm* — Coats & Bennett, P.L.L.C.

(57) ABSTRACT

A digital-to-analog upconverter directly converts a baseband digital value comprising a plurality of bits to an RF analog signal to combine digital-to-analog operations with frequency upconversion operations. One exemplary digital-to-analog upconverter comprises a plurality of conversion units, one for each of the plurality of bits in the baseband digital value, and an output node coupled to each of the conversion units. Each conversion unit generates a weighted analog signal at a low frequency or at a radio frequency responsive to the corresponding input bit and an oscillator signal at RF. The weighting factor of each conversion unit corresponds to a relative weighting of the corresponding bit. The output node combines the weighted analog signals to generate a combined RF analog signal representative of the baseband digital value.

20 Claims, 11 Drawing Sheets

DOUBLE BALANCED DIGITAL TRANSMITTER

This application is a continuation-in-part of and claims priority to International Application No. PCT/EP2009/067812, which is published as WO 2010/076272, and which is incorporated by reference herein.

The invention disclosed herein generally relates to a digital-to-analog converter, and more particularly relates to a digital-to-analog upconverter configured to convert a baseband digital value to an RF analog signal.

BACKGROUND

Digital-to-Analog Converters (DACs) are used for a wide range of applications. For example, DACs may be used in wireless transmitters to convert digital signals generated by the transmitter's baseband to appropriate analog signals for transmission by an antenna. In a typical transmitter, a digital signal is first converted to an analog signal using a DAC, and then the analog signal is passed through filters, mixers, and amplification stages to generate an upconverted RF analog signal ready for power amplification and transmission.

Existing techniques require a large number of functional blocks to process the signals, which requires a large silicon area on the transmitter integrated circuit (TXIC). Further, existing techniques require a large amount of analog signal processing. These problems make it more difficult to implement transmitters using, for example, modern Complimentary Metal Oxide Semiconductor (CMOS) manufacturing techniques.

Power consumption represents another important design parameter. In many wireless transmitter designs, such as those used in mobile telephones, it is often necessary to minimize power consumption, and therefore to use a low voltage power supply. However, the reliance on the performance of many analog components in existing designs results in either increased power consumption requirements, or reduced performance in low power designs.

SUMMARY

To address the power consumption and size issues associated with conventional digital-to-analog converters (DACs), a digital-to-analog upconverter disclosed herein combines the digital-to-analog conversion operations with frequency upconversion operations by directly converting a baseband digital value comprising a plurality of digital signals, e.g., bits, to an RF analog signal. Generally, each bit of the baseband digital value nulls or modulates an oscillator signal to produce a low frequency (e.g., DC) or radio frequency signal. The low/radio frequency signals are weighted and combined to generate an RF analog signal. For example, one exemplary digital-to-analog upconverter comprises a plurality of conversion units, where different conversion units correspond to different digital signals of the baseband digital value, and an output node coupled to each conversion. Each conversion unit generates a weighted analog signal at a low frequency or at RF, referred to herein as a weighed analog RF signal, responsive to the corresponding input digital signal and an oscillator signal at RF. The weighting factor of each conversion unit corresponds to a relative weighting of the corresponding bit. The output node combines the weighted analog signals to generate a combined RF analog signal representative of the baseband digital value. A corresponding method is also disclosed herein.

DETAILED DESCRIPTION

Figure 1:
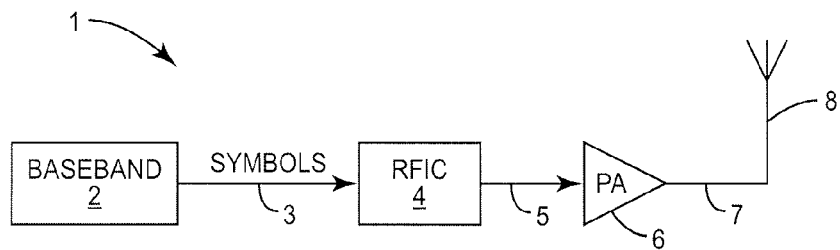
FIG. 1 depicts a block diagram of a wireless system comprising a wireless transmitter.

FIG. 1 is a block diagram of a wireless transmitter 1, which may be used in a mobile telephone. The transmitter 1 comprises a baseband section 2 which generates and outputs digital data in the form of symbols 3 to a Radio Frequency Integrated Circuit (RFIC) 4. The symbols represent the digital data that is to be transmitted by the transmitter 1, and are derived from signals received by the baseband section 2 from one or more input devices (not shown), e.g., a keyboard and a microphone. The RFIC 4 performs various processing on the symbols 3 generated by the baseband section 2, including converting the digital data into an analog signal suitable for transmission. RFIC 4 also filters, mixes, and amplifies the analog signal. The processed analog signal 5 generated by the RFIC 4 is provided to a Power Amplifier (PA) 6, which performs further amplification of the signal before the amplified signal 7 is transmitted by an antenna 8.

Figure 2:
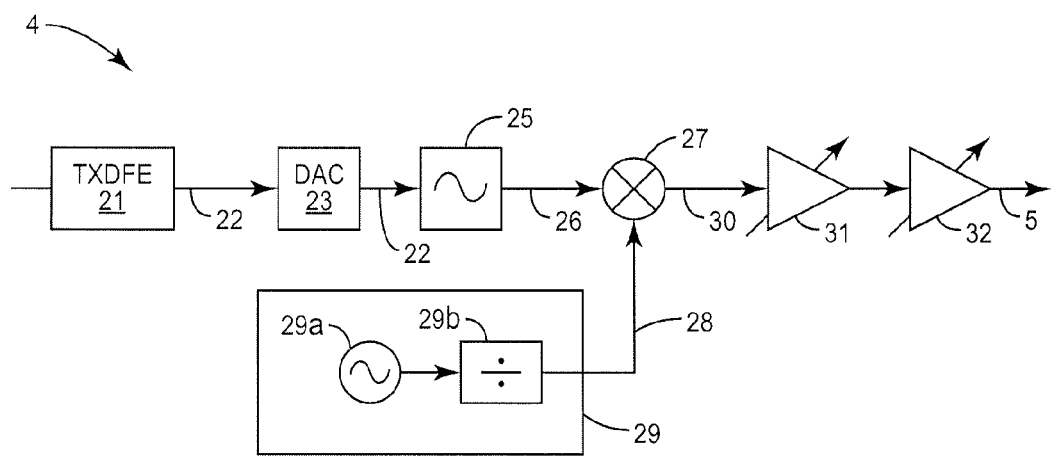
FIG. 2 depicts a block diagram of the RFIC of FIG. 1.

FIG. 2 depicts a conventional RFIC 4 for FIG. 1 in more detail. The symbols 3 received by the RFIC 4 from the baseband section 2 are first provided to a Transmitter Digital Front End (TXDFE) 21. The TXDFE 21 performs any remaining digital pre-processing required before digital-to-analog conversion takes place. The output 22 of the TXDFE 21 is provided to a DAC 23, which converts the digital data 22 into an analog signal 24. The analog signal 24 passes through separate filter, mixer, and amplifier stages. In particular, the analog signal 24 first passes through a filter 25. Mixer 27 mixes the filtered signal 26 with a Local Oscillator (LO) signal 28 to upconvert the filtered signal to RF. The LO signal 28 is derived from LO 29, for example, by dividing an appropriate oscillator signal from a crystal oscillator 29a in a divider 29b. The analog RF signals 30 output by the mixer 27 are passed to an amplification stage which includes at least two amplifiers 31, 32. The amplifiers 31, 32 perform gain control and provide the output 5 for the RFIC 4. As seen in FIG. 1, the output 5 of the RFIC 4 is further amplified by PA 6 to generate the transmitter signal 7 to be transmitted by antenna 8.

Figure 3:
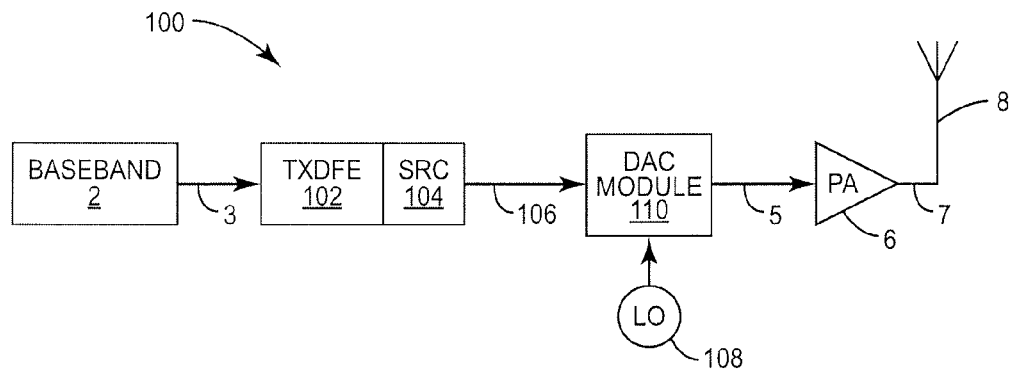
FIG. 3 depicts a block diagram of a wireless system comprising a wireless transmitter according to one exemplary embodiment.

FIG. 2 and the foregoing demonstrate that conventional arrangements use a significant number of analog components, and that the amount of analog signal processing performed by the RFIC 4 is relatively high. FIG. 3 depicts a block diagram of a wireless transmitter 100 according to the present invention that reduces the number of analog components, which results in less analog processing and a smaller silicon area.

The transmitter 100 comprises a baseband section 2, a TXDFE 102 combined with a Sample-Rate Converter (SRC) 104, a DAC module 110, a PA 6, and an antenna 8. As before, the baseband section 2 generates symbols 3 representing digital data to be transmitted. The symbols 3 are provided to the TXDFE 102 for processing. SRC 104 is arranged to increase or decrease the sample rate of the digital data provided by TXDFE 102 as necessary. For example, in some embodiments, the DAC module 110 may require a specific sample rate which is not provided by the baseband section 2 and/or TXDFE 102.

The DAC module 110 receives the baseband digital data 106 and LO signal and produces an output 5 in the form of an analog RF signal as described in greater detail below. The DAC module 110 therefore performs digital-to-analog upconversion of the data 106. The digital-to-analog upconversion is performed in such a way, however, that the amount of analog processing and power consumption may be minimized. The analog signal 5 generated by the DAC module 110 is provided to the PA 6, which generates an amplified signal 7 for transmission via antenna 8.

Figure 4:
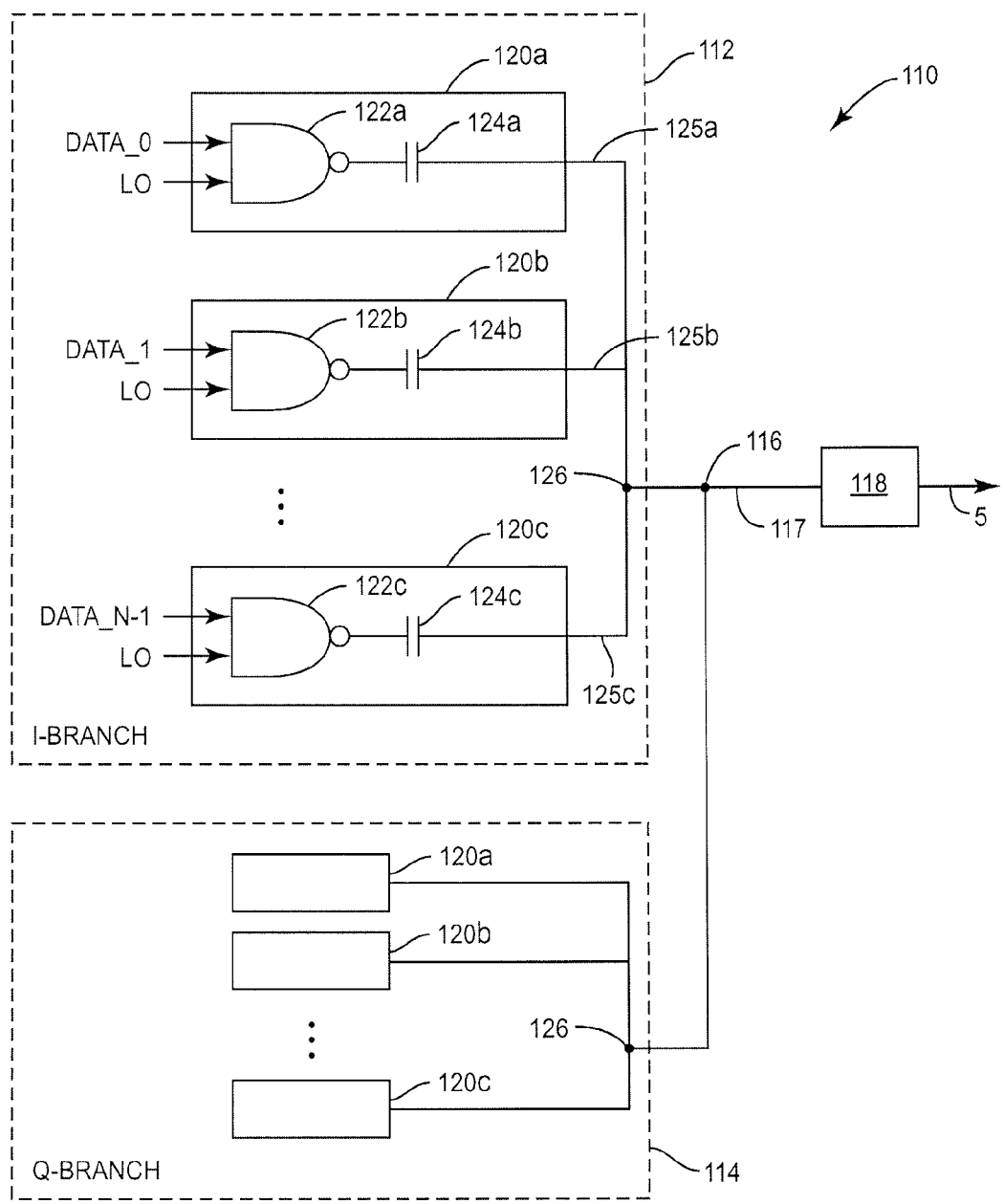
FIG. 4 depicts a circuit diagram of an exemplary DAC module for FIG. 3.

DAC module 110 comprises a digital-to-analog upconverter, one embodiment of which is depicted in more detail in FIG. 4. In the embodiment of FIG. 4, DAC module 110 comprises a plurality of conversion units 120 and a combiner or combining node 126. In general, the conversion units 120 receive a series of one or more digital signals representing a digital value. For example, each digital signal may comprise one or more bits of the digital value. The following describes the invention in terms of a digital value, where different bits of the digital value are input to different conversion units 120. It will be appreciated, however, that each conversion unit 120 may receive any digital signal, e.g., one comprising two or more bits.

The DAC module 110 receives a digital value comprising N bits, where different ones of the N bits are applied to different conversion units 120 to produce an RF analog signal therefrom. The N-bit digital value corresponds to the digital data stream 106 output by the TXDFE 102 and SRC 104. FIG. 4 depicts an In-phase branch (I-branch) 112 of the DAC module 110 in detail. In practice, for image rejection, a Quadrature branch (Q-branch) 114 is also provided. The Q-branch 114 comprises the same circuit as the I-branch 112, e.g., the same plurality of conversion units 120 and the common adding combining node 126. However, the LO signals received by the conversion units 120 of the Q-branch 114 are out of phase from the LO signals received by the conversion units 120 of the I-branch 112, e.g., by 90°. The I-branch 112 receives the I component of the digital value while the Q-branch 114 receives the Q component of the digital value. As seen in FIG. 4, the separate combining nodes 126 of the I- and Q-branches 112, 114 are connected at another common node 116.

Each conversion unit 120 includes a logic unit 122 and a weighting unit 124. The logic units 122 modulate or null the oscillator signal responsive to the corresponding input digital bit to generate an RF signal. This may be performed, for example, by multiplying the oscillator signal LO with the input digital bit using a NAND, AND, OR, NOR, XOR, or XNOR logic gate, inverter, three-state inverter, transmission gate, series switches, or any other suitable means. When a logic gate is used, e.g., an OR, NOR, NAND, or AND gate, the result is a signal which is substantially constant when the input bit is in a first state (e.g., a high or low state), and is an oscillating signal at RF when the input bit is in a second state (e.g., a low or high state).

The weighting units 124 comprise weighted capacitor units that convert the signal output by the corresponding logic unit 122 to a weighted analog RF signal 125. The weighted analog RF signals 125 are combined at junction 126 to produce a combined RF analog signal 117 whose amplitude is representative of the input digital value. For example, the combined RF analog signal 117 comprises a weighted sum, or other suitable combination, of the individual weighted analog signals 125. The weighting applied by weighting units 124 depends on the weight of the respective input bits. For example, if the digital value represents a binary number, each weighting unit 124 applies the binary weighting associated with the corresponding input bit within the binary number. In various embodiments, weighting units 124 may use capacitors, resistors, inductors or any other suitable means to control the relative amplitude of the individual upconverted signals output by the logic units 122.

In the embodiment of FIG. 4, the logic units 122 of the conversion units 120 comprise NAND gates 122a-c, each one associated with a respective bit of an input digital value. There are therefore as many NAND gates 122a-c as the number of bits in the input digital value, although only three gates 122a-c are depicted in FIG. 4 for simplicity. Each NAND gate 122a-c processes a respective signal representing one bit of the digital value to upconvert that signal to RF. To achieve this, each NAND gate 122a-c receives an oscillator signal LO as a first input. The LO may be, for example, a sine wave or square wave of a desired frequency. The second input of each NAND gate 122a-c comprises a respective bit of the N-bit digital value. For example, the first NAND gate 122a receives bit 0 of the N-bit digital value, NAND gate 122b receives bit 1 of the N-bit digital value, and so on, until the last NAND gate 122c receives bit N−1 of the N-bit digital value. When the data bit input into one of the NAND gates 122 is equal to 1 then the output of that NAND gate 122a-c will be equal to an inverted version of the LO signal. If the data bit has a value of 0, then the NAND gate 122a-c nulls the LO signal to output a low frequency signal, e.g., a DC signal equal to 1. In this way, the resulting output signals of the NAND gates 122a-c represents the digital data (e.g., respective digital values) transferred to RF. These upconverted signals drive the weighting units 124. As mentioned above, the NAND gates 122a-c may be replaced with any other suitable component that multiplies the LO signal with an input bit of the digital value, e.g., an OR, NOR, or AND, logic gate.

The RF signals output by the NAND gates 122a-c drive a series of respective weighting units 124, which may comprise the weighted capacitors 124a-c depicted in FIG. 4. The output of each NAND gate 122a-c is connected to one plate of a respective capacitor 124a-c and the other plate of each capacitor 124a-c is connected to a common combining node 126. The combining node 126 is, in turn connected (possibly via a matching circuit 118 discussed below) to the output of the DAC module 110. When the DAC module 110 includes both an I-branch 112 and a Q-branch 114, an additional common combining node 116 combines the analog I and Q RF analog signals output by the respective I and Q branches 112, 114 to generate the combined RF analog signal 117.

For binary values, the value of each capacitor 124a-c is binary weighted according to the binary weight of the particular data bit involved in driving the capacitor. For example, the capacitor 124 connected to the output of the NAND gate 122 that receives bit n of the N-bit digital value has a capacitor value of 2nC, where C is a reference value selected according to the desired relative magnitude of the output signal. In this example, the least significant bit is numbered as n=0 so that the bits of the N-bit value are numbered from 0 to N−1. It will be appreciated that when the digital value comprises a binary value, the n=0 capacitor 124 may be omitted. The result is that the capacitors 124 control the relative amplitudes of the upconverted signals output by the NAND gates 122 according to the binary weighting of the respective bits of the input digital value. The common combining node 126 acts to add or combine the weighted analog RF signals 125. Each data bit therefore contributes to the signal magnitude at the combining node 126 according to the bit value (e.g., 0 or 1), as well as according to the weight of the corresponding capacitor 124, which in turn depends on the binary weight of the bit in question. The resulting analog signal generated at the common adding point 126 therefore has a magnitude that is proportional to the input digital value. As a stream of digital values is input into the DAC module 110, the magnitude of the analog signal varies accordingly.

The weighting of the capacitors 124 is chosen depending on the coding used to represent the value. In the example above, a binary representation of the value is used so the capacitors 124 are binary weighted. However, if thermometer coding is used such that the input signals are of equal weight then the RF signals are combined with equal weight. In this case, weighted capacitors 124 may not be required, or may comprise capacitors 124 with equal weight. It is also understood that the capacitors 124 may be replaced with any other suitable component to modify the amplitude of the radio-frequency signals, e.g., resistors or inductors. The signals may also be combined by means other than the common combining nodes 126, 116 depicted in FIG. 4.

Figure 5:
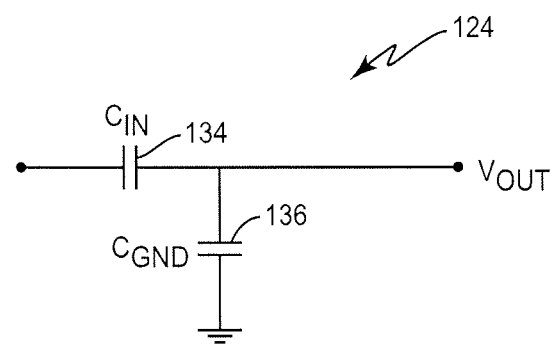
FIG. 5 depicts a circuit diagram of an exemplary weighting unit for the DAC module of FIG. 4.
Figure 7:
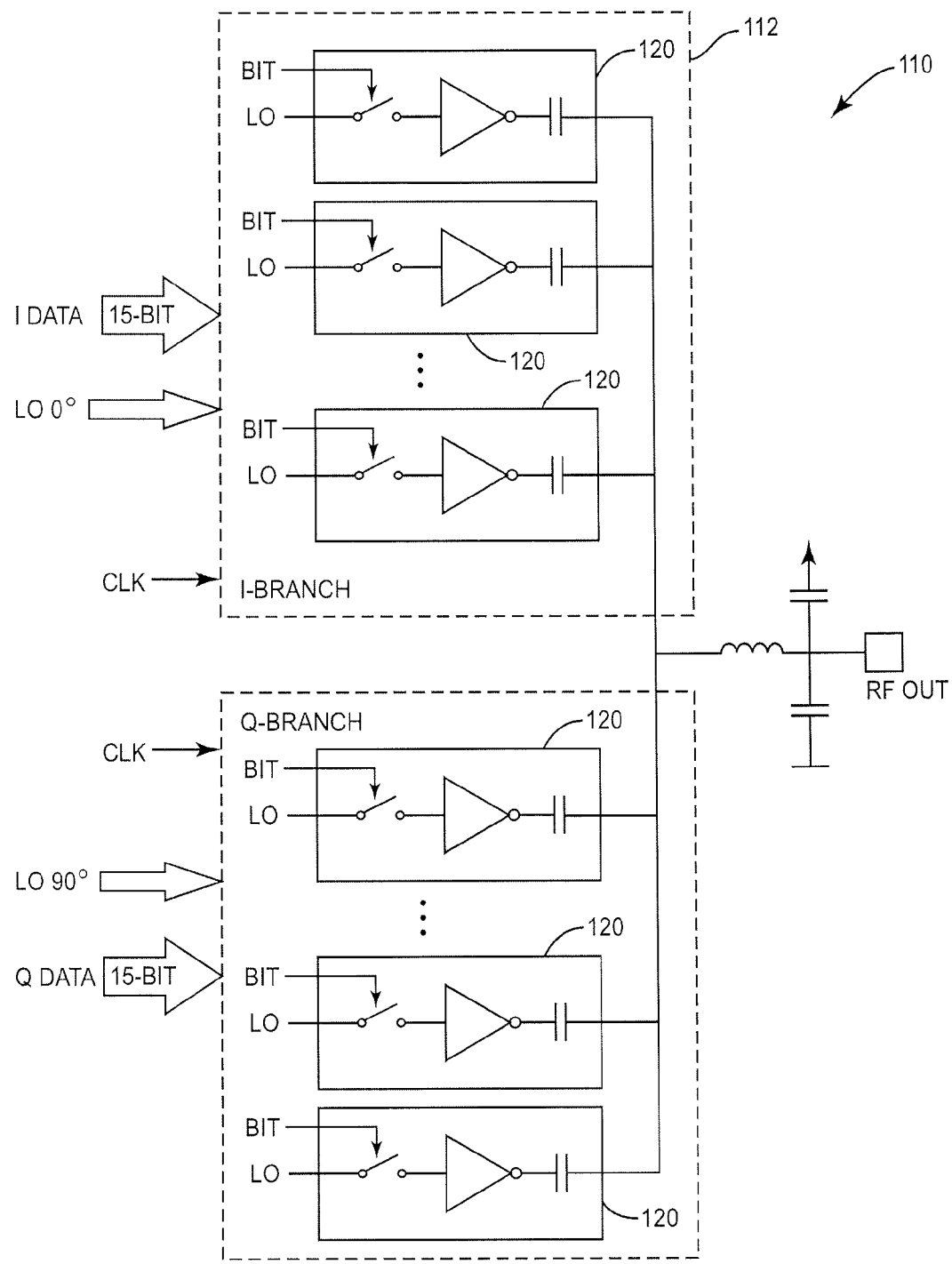
FIG. 7 depicts a circuit diagram of an exemplary DAC module for FIG. 3.

Although weighting units 124 are depicted as single capacitors, one or more of the weighted capacitors 124 could alternatively be replaced by a series of capacitors together having an equivalent capacitance. For example, a group of capacitors that are connected together to achieve a desired capacitance may be regarded simply as a single capacitor 124 (FIG. 4) having the overall capacitance. FIG. 5 depicts an exemplary weighting unit 124 that collectively represents all of the weighting units 124 in the I-branch 112 (or alternatively the Q-branch 114). The collective weighting unit 124 comprises an input capacitor $C_{in}$ 134 and a ground capacitor $C_{gnd}$ 136, where the output voltage $V_{out}$ varies based on the values of $C_{in}$ 134 and $C_{gnd}$ 136 according to $V_{out}=V_{in}(C_{in}/(C_{in}+C_{gnd}))$. The capacitor ratio can be controlled by enabling or disabling inverters (depicted in FIG. 7) driving the capacitors 134, 136. For example, if the inverter drives the weighting unit 124, the capacitance of the weighting unit 124 is $C_{in}$, while if the inverter does not drive the weighting unit 124, the capacitance of the weighting unit 124 is $C_{gnd}$. The values for $C_{in}$ and $C_{gnd}$ may be computed for a particular digital value according to $C_{in}=N_{active}*C_{unit}$ and $C_{gnd}=N_{shutdown}*C_{unit}$, where $N_{active}$ represents the number of active conversion units 120, $N_{shutdown}$ represents the number of shut down conversion units 120, and $C_{unit}$ represents a fixed capacitor value. A conversion unit 120 is active when the LO signal is selected by the corresponding logic unit 122, and is inactive or shutdown when the ground or reference voltage (e.g., FIG. 8) is selected by the corresponding logic unit 122.

In one embodiment, the capacitors are in the form of Metal-Oxide-Metal (MOM) capacitors, although it is understood that other forms of capacitor could be used. The performance of the DAC module 110 is characterized by the capacitor values, and the accuracy of the digital-to-analog conversion depends on the matching of the capacitors 124. In practice, matching of the capacitors 124 can be performed accurately.

Figure 6:
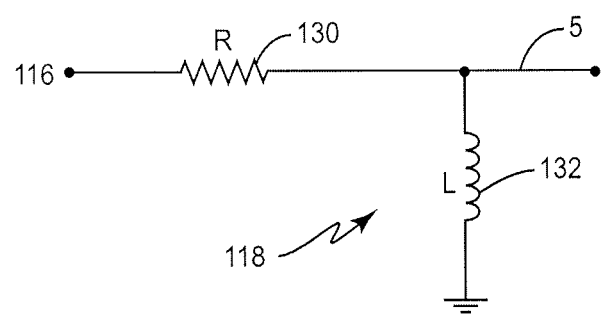
FIG. 6 depicts a circuit diagram of an exemplary matching unit for the DAC module of FIG. 4.

The embodiment depicted in FIG. 4 includes an optional matching circuit 118 connected between the combining node 116 and the DAC output. Matching circuit 118 is used to match the impedance of the DAC module 110 to a particular reference value, e.g., 50Ω. By ensuring that the input impedance is lower than the output impedance, an increase in voltage at the output may be achieved, resulting in improved performance. The matching circuit 118 may be of any suitable design, one example of which is depicted in FIG. 6. This matching circuit 118 comprises a resistor 130 connected between the combining node 116 and the output, and an inductor 132 connected between the output and ground. The values of the resistor 130 and inductor 132 may be chosen, for example, so that a desired impedance, e.g., 50Ω, is achieved. It is understood that other matching circuits 118 may be used, e.g., one using a capacitor and inductor in place of the inductor 132 and resistor 130 depicted in FIG. 6.

Figure 8:
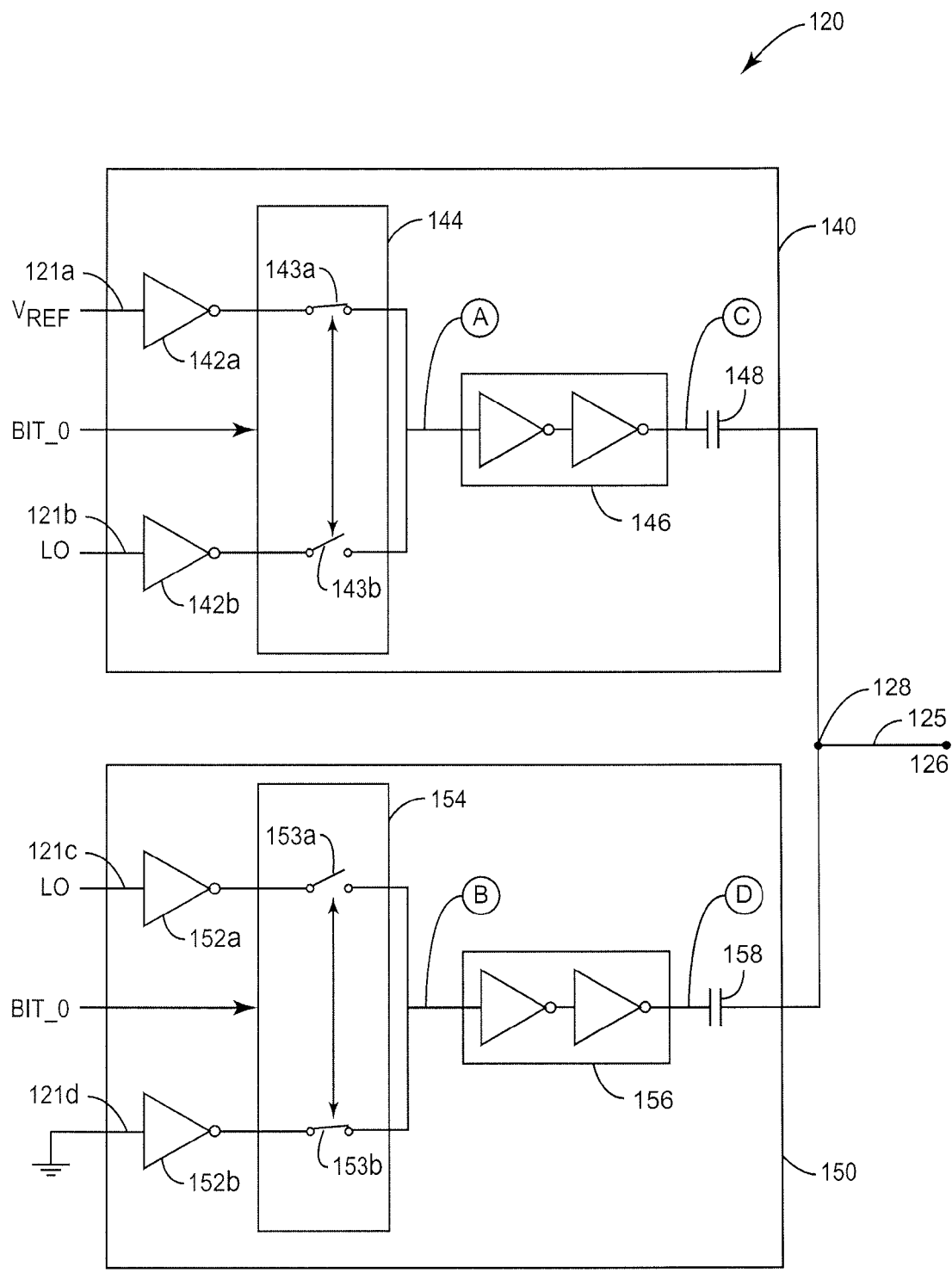
FIG. 8 depicts a circuit diagram of another exemplary conversion unit for the DAC module of FIG. 4.

FIG. 8 depicts one embodiment of a conversion unit 120 used in the DAC module 110 depicted in FIG. 4. The circuit depicted in FIG. 8 corresponds to conversion unit 120 comprising a single NAND gate 122 and capacitor 124 connected in series. Therefore, N copies of the circuit of FIG. 8 are used to implement the I-branch 112 and N copies are used to implement the Q-branch 114 of the DAC module 110. The outputs of the N copies of the circuit 120 depicted in FIG. 8 that form the I or Q branches 112, 114 connect at the common adding point 126 to form the I or Q outputs, and the I and Q outputs connect at the common adding point 116 to output the combined RF analog signal 117.

The conversion unit 120 comprises four inputs 121a-d. The first input 121a is connected to a reference voltage $V_{REF}$ (not depicted in FIG. 4), the second and third inputs 121b, 121c are connected to the LO signal, and the fourth input 121d is connected to ground (not depicted in FIG. 4). The first and second inputs 121a, 121b are input to a reference branch 140, while the third and fourth inputs 121c, 121d are input to a ground branch 150. Inputs 121a, 121b are connected respectively to two respective inverters 142a, 142b, which invert the respective input signals. The output of each inverter 142a, 142b is connected to a switch unit 144 comprising first and second switches 143a, 143b, which may comprise transistor switches. Each switch 143a, 143b is controlled by the data bit corresponding to this conversion unit 120 of the DAC module 110, which in this example is bit_0 of the digital value. In the depicted embodiment, bit_0=0, and therefore, shuts down/deactivates the conversion unit 120. While each switch 143a, 143b is controlled by the same bit, the switches 143a, 143b are oppositely connected so that only one of the input signals passes through switch unit 144. For example, when the bit is equal to 0 the inverted $V_{REF}$ signal passes through switch unit 144, but the inverted LO signal does not. If the data bit is equal to 1 then the inverted LO signal passes through the switch unit 144, but the inverted $V_{REF}$ signal does not. A similar operation occurs for the ground branch 150. More particularly, inputs 121c, 121d are connected respectively to two respective inverters 152a, 152b, which invert the respective input signals. The output of each inverter 152a, 152b is connected to a switch unit 154 comprising first and second switches 153a, 153b, which in the depicted embodiment are the form of transistor switches 153a, 153b. Each switch 153a, 153b is controlled by the data bit corresponding to this conversion unit 120 of the DAC module 110, which in this example is bit 0 of the digital value. While each switch 153a, 153b is controlled by the same bit, the switches 153a, 153b are oppositely connected so that only one of the input signals passes through switch unit 154. For example, when the bit is equal to 0 the inverted ground signal passes through switch unit 154, but the inverted LO signal does not. If the data bit is equal to 1 then the inverted LO signal passes through the switch unit 154, but the inverted ground signal does not.

The output of switch unit 144 connects to a set of inverters 146 connected in series, and the output of switch unit 154 connects to another set of inverters 156 connected in series. The sets of inverters 146, 156 buffer the signals output by the switch units 144, 154. While FIG. 8 depicts reference and ground branches 140, 150 both having sets of inverters 146, 156 comprising two inverters each, it will be appreciated that each set 146, 156 may have more than two inverters, and that each set 146, 156 may have a different number of inverters.

The outputs of the two sets of inverters 146, 156 respectively connect to one plate of capacitors 148, 158, which are collectively equivalent to one of the capacitors 124 depicted in FIG. 4. The other plate of each capacitor 148, 158 connects together at a common point 128 to provide the weighted analog RF signal 125.

Figure 9:
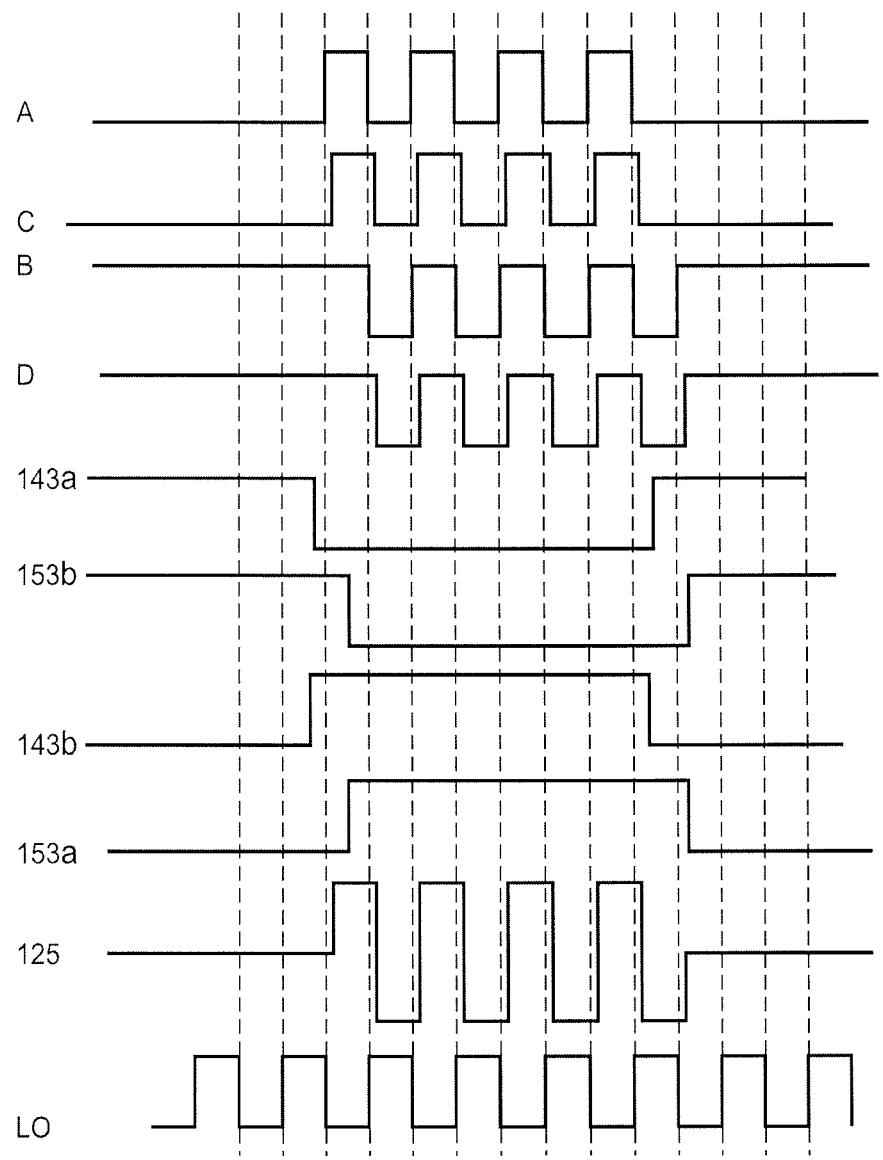
FIG. 9 depicts an exemplary signal diagram for the conversion unit of FIG. 8.

FIG. 9 depicts a signal diagram of exemplary signals for the components and signal lines of FIG. 8 when the data bit (e.g., bit_0) modulates the LO signal, e.g., is a "1". As depicted in FIG. 9, when switch 143b closes, switch 143a opens so that only the LO signal applied to the reference branch 140 passes to the set of buffer inverters 146. Similarly, when switch 153a closes, switch 153b opens so that only the LO signal applied to the ground branch 150 passes to the set of buffer inverters 156. While switch units 144, 154 are controlled by the same bit, the timing of the switching implemented by switch unit 154 is slightly offset from the timing of the switching implemented by switch unit 144, as depicted in FIG. 9, due to the logic used to control the switches (not shown) and due to timing circuitry (not shown) used to address the timing of the reference and ground branches 140, 150. After being weighted by capacitors 148, 158, signals C and D are combined at common point 128 to generate the weighted analog RF signal 125 at RF output by this conversion unit 120 for bit_0.

In the embodiments described above, the digital values comprise unsigned digital values, each having a magnitude but not a sign (e.g., positive or negative). However, in other embodiments, the digital values may comprise signed values, each having both a magnitude and a sign. The use of signed digital values doubles the range of the digital values available to the transmitter 1. The sign of a digital value may be represented in any suitable way, for example using a sign bit whose value represents whether the digital value is positive or negative. One embodiment in which signed digital values are used will now be described. This embodiment is similar in design to the embodiment depicted in FIGS. 4-9. However, rather than using an oscillator signal as previously described, either a non-inverted oscillator signal (referred to herein as LO) or an inverted oscillator signal (referred to herein as xLO) is used depending on the sign of the digital value. In an embodiment in which the oscillator signal LO is a square wave oscillating between high and low states, the inverted oscillator signal xLO comprises a square wave having a low state when the non-inverted oscillator signal LO has a high state, and having a high state when the non-inverted oscillator signal LO has a low state. In an embodiment in which the oscillator signal LO is a sine wave, the inverted oscillator signal xLO comprises a sine wave having the opposite sign or a phase shift of 180°. The non-inverted oscillator signal LO and inverted oscillator signal xLO may be derived from the same oscillator source 108.

A sign module (not shown) may be provided to determine the sign of the digital value provided to the DAC module 110, for example by examining the state of the sign bit, and to selectively provide a non-inverted oscillator signal LO or inverted oscillator signal xLO to the DAC module 110 by multiplying the non-inverted signal LO by the sign. For example, if the digital value is positive then the sign module selects a non-inverted oscillator signal LO generated by an oscillator 108 by multiplying the LO signal by a positive sign. The sign module is also arranged to invert the oscillator signal generated by the oscillator 108, and if the digital value is negative then the sign module generates and selects the inverted oscillator signal xLO by multiplying the LO signal by a negative sign. The non-inverted oscillator signal LO or inverted oscillator signal xLO selected by the sign module is provided to a conversion unit 120 similar to that depicted in FIG. 4 in place of the oscillator signal (LO). If a stream of signed digital values is input into the DAC module 110, then the oscillator signal provided to the conversion unit 120 depicted in FIG. 4 may switch between a non-inverted oscillator signal LO and an inverted oscillator signal xLO according to the changing sign of the input values.

Figure 10:
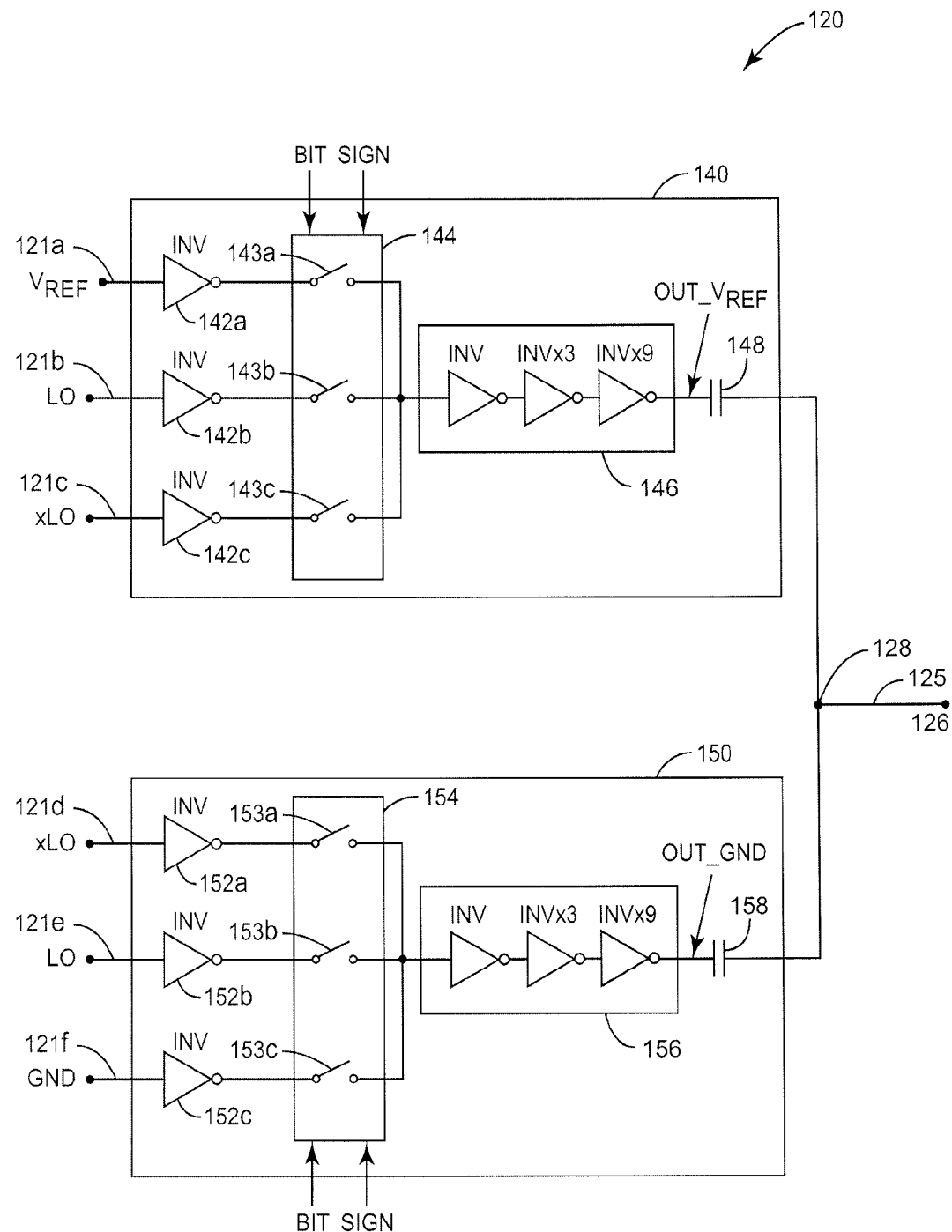
FIG. 10 depicts an exemplary circuit diagram for another conversion unit for the DAC module of FIG. 4.

FIG. 10 depicts an alternative embodiment of a conversion unit for the DAC module 110 in which signed values are used, where LO and xLO are both applied to each conversion unit 120, and where the conversion unit 120 uses either the LO or the xLO signal. This arrangement is similar to that depicted in FIG. 8. As before, only a single conversion unit 120 of the DAC 110, representing the circuitry for processing a single bit of the digital value, is depicted. Similar conversion units 120 (not shown) are also provided for each remaining bit of the digital value representing the magnitude of the digital value, and the resulting individual signals are then combined to derive the analog signal as described above.

The conversion unit 120 comprises six inputs 121a-f. The first input 121a is connected to a reference voltage $V_{REF}$ and the sixth input 121f is connected to ground. The second and fifth inputs 121b, 121e are connected to LO, and the third and fourth inputs 121c, 121d are connected to xLO. The first, second, and third inputs 121a, 121b, 121c are input to the reference unit 140, where they are connected to respective inverters 142a-c, which invert the respective input signals 121a-c. The fourth, fifth, and sixth inputs 121d, 121e, 121f are input to the ground unit 150, where they are connected to respective inverters 152a-c, which invert the respective input signals 121d-f. The output of each inverter 142a-c, 152a-c connects to a respective switch unit 144, 154, which may, for example, comprise a transistor switch 143a-c, 153a-c for each inverter output.

The data bit corresponding to the conversion unit 120 controls each switch unit 144, 154, and therefore each switch unit 144, 154 in this conversion unit 120 is controlled using the same data bit. When the input data bit equals 0, switch units 144, 154 pass the inverted $V_{REF}$ and ground signals but do not pass the inverted LO/xLO signal. When the input data bit equals 1, the switch units 144, 154 pass the inverted LO/xLO signal but do not pass the inverted $V_{REF}$ and ground signals. In this case, switches 143a, 143b, 153a, 153b are also controlled by the sign bit of the value. Specifically, if the input data bit equals 1 and the sign bit equals 0, then switch units 144, 154 pass the inverted LO signals but not the inverted xLO signals.

If the input data bit equals 1 and the sign bit equals 1, switch units 144, 154 pass the inverted xLO signals but not the inverted LO signals.

The outputs of switch units 144, 154 respectively connect to a set of inverters 146, 156 connected in series, which buffer the signals output by the switch units 144, 154. The sets of inverters 146, 156 may comprise an odd or even number of inverters, and each set 146, 156 may comprise the same number or a different number of inverters. For example, set 146 and set 156 may each comprise the same number of inverters (e.g., FIGS. 8 and 10). Alternatively, one set, e.g., the set 156, may have an even number of more inverters than the other set, e.g., the set 146, to generate more delay in the ground unit 150. In another alternative embodiment, one set, e.g., the set 156, may have an odd number more inverters that the other set, e.g., the set 146, which effectively implements an additional logic inversion in that set of inverters 156 relative to the other set of inverters 146. This extra logic inversion facilitates driving the set of inverters 156 with xLO while simultaneously driving the other set of inverters 146 with LO, depending on the sign. Generating the weighted analog RF signal 125 in this manner, e.g., by using xLO and LO at the same time, enables the phase accuracy requirements for the LO and xLO signals to be relaxed.

The output of the each set of inverters 146, 156 connects to one plate of respective capacitors 148, 158. The other plates of the capacitors 148, 158 connect at point 128 to generate the weighted analog RF signal 125 for that bit. It can be seen that the circuit depicted in FIG. 10 functions in the same way as the circuit depicted in FIG. 8 except that LO and xLO signals are selectively used in FIG. 10, instead of an unconditional LO signal used in FIG. 8, depending on the sign of the digital value. As with the arrangement of FIG. 8, the weighted analog RF signal 125 of the circuit in FIG. 10 is combined with the weighted analog RF signals 125 of the similar conversion units 120 corresponding to the other data bits to produce the combined RF analog signal corresponding to the digital value.

Figure 11:
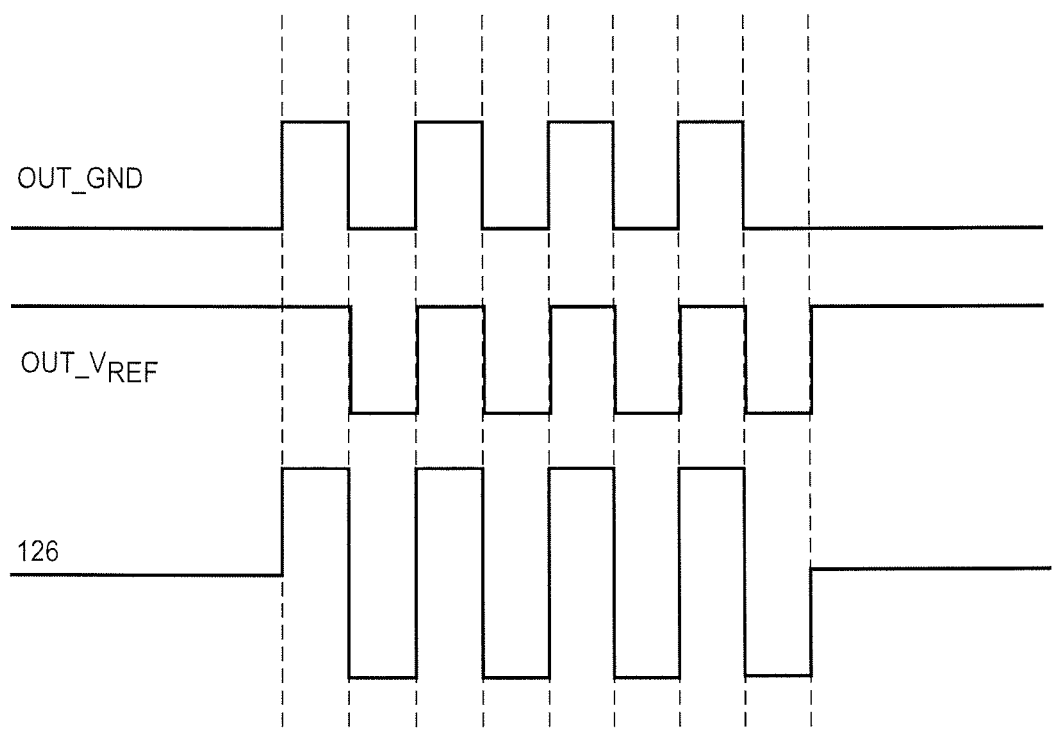
FIG. 11 depicts an exemplary signal diagram for the conversion unit of FIG. 10.

FIG. 11 depicts a signal diagram of exemplary OUT_GND, OUT_$V_{REF}$, and 126 signals from FIG. 10. The embodiment of FIG. 10 uses two capacitors 148, 158 in each conversion unit 120 to achieve symmetric zeroing, depicted in FIG. 11. This symmetric zeroing means that for each conversion unit 120, the DC level of the output should be constant regardless of whether the cell is transmitting a signal or not.

As can be seen from the foregoing, the structure of the DAC module 110 is less complicated than previous digital-to-analog conversion implementations. Furthermore, a smaller number of analog components are required relative to known devices resulting in reduced analog processing. For example, the NAND gates 122*a-c* are digital components. Embodiments of the invention provide a DAC 110 in which power consumption, noise, and silicon area may be reduced.

Figure 12:
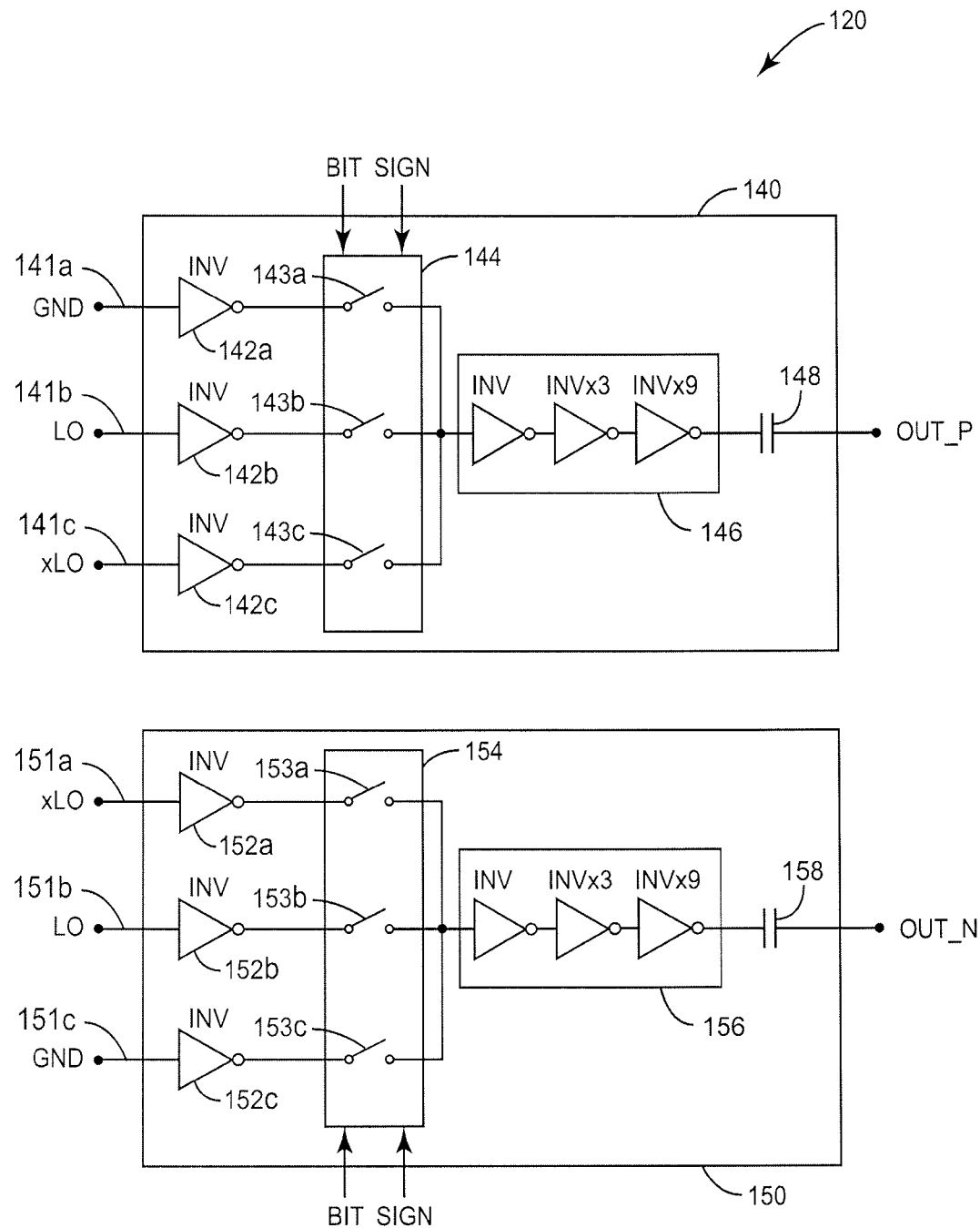
FIG. 12 depicts an exemplary circuit diagram for another conversion unit for the DAC module of FIG. 4.
Figure 13:
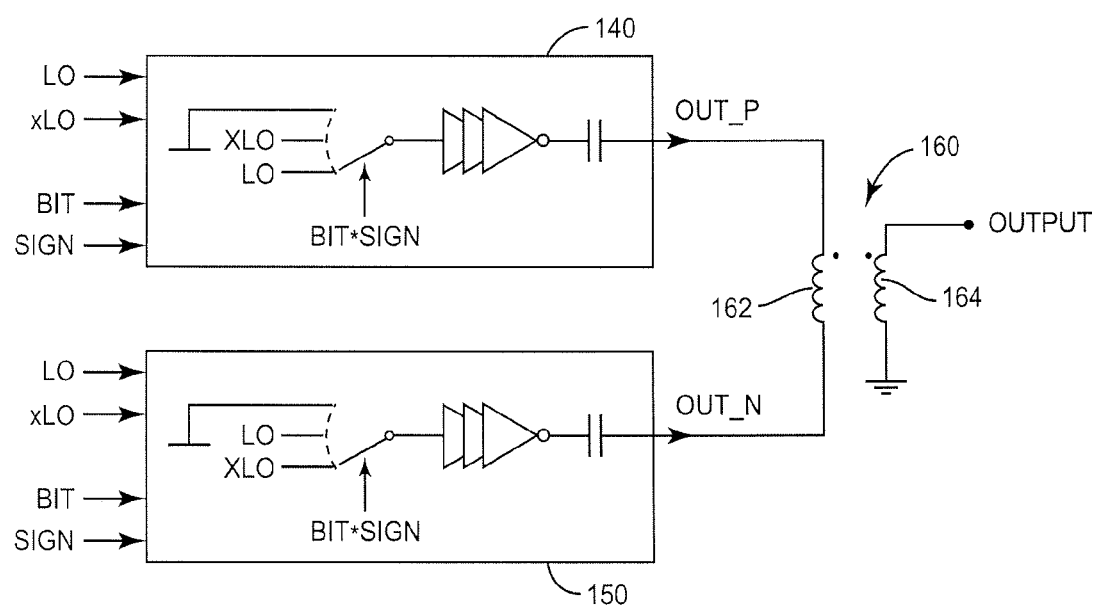
FIG. 13 depicts an exemplary circuit diagram for another conversion unit for the DAC module of FIG. 4.
Figure 14:
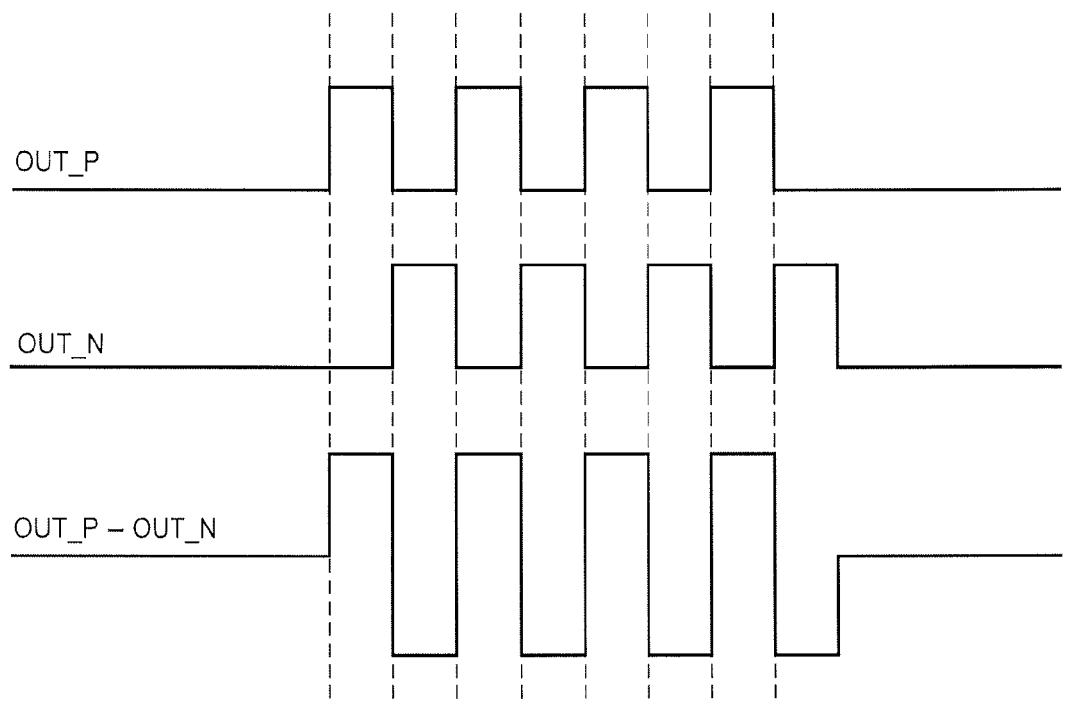
FIG. 14 depicts an exemplary signal diagram for the conversion unit of FIG. 13.

FIGS. 12-14 depict an alternate embodiment of a conversion unit 120 that decouples the outputs of the reference and ground branches 140, 150 to produce a differential embodiment with separate positive (reference branch 140) and negative (ground branch 150) branches. In this embodiment, both branches 140, 150 are equal, because both are shut down the same way, e.g., both have an input connected to the same DC reference voltage (e.g., GND) to enable both to disconnect from the LO/xLO signals to shut down to the same reference voltage. In the embodiment of FIG. 12, both branches 140, 150 shut down to a reference voltage of ground. It will be appreciated, however, that any DC reference voltage may be used, e.g., $V_{REF}$. The previously discussed symmetric zeroing requirement is fulfilled in this embodiment by turning the DC-jump of FIG. 10 into common mode (see FIG. 14). The differential embodiment of FIG. 12 still requires some common mode means for combining OUT_P and OUT_N, e.g., a balun 160 as depicted in FIG. 13, where one end of an input winding 162 connects to OUT_P and the other end connects to OUT_N, and where one end of an output winding 164 provides the output signal (e.g., the weighted analog output) and the other end connects to ground. It will be appreciated that other common mode rejection elements may be used, e.g., a differential inductor. FIG. 13 depicts a single conversion unit 120 coupled to the balun 160. It will be appreciated that the OUT_P from each of the conversion units 120 couples to one end of the input winding 162, and the OUT_N from each of the conversion units 120 couples to the other end of the input winding 162.

The embodiment of FIG. 12 uses the LO and xLO signals all the time, regardless of the sign. More particularly, when the bit does not shut down the branches 140, 150, the sign controls the switches in one branch 140, 150 to output the inverted version of the LO signal and controls the switches in the other branch 140, 150 to output the inverted version of the xLO signal. For example, if sign=1, the switches in branch 140 are configured to output the inverted version of the LO signal, while the switches in branch 150 are configured to output the inverted version of the xLO signal. If sign=0, the switches in branch 140 are configured to output the inverted version of the xLO signal, while the switches in branch 150 are configured to output the inverted version of the LO signal. Thus, both branches 140, 150 in the conversion unit 120 of FIG. 12 use LO and xLO signals, depending on the phase/sign of the signal to be transmitted. As a result, the conversion unit 120 of FIG. 12 does not require propagation delay matching for LO and xLO signals. For example, if the phase of the LO signal is 0°, the phase of the xLO signal should be 180°. Any delay in the xLO signal causes the output phase to vary between 0° and 178°, which degrades the noise performance in the conversion unit 120 of FIG. 10. With the differential implementation of FIG. 12, the OUT_P and OUT_N signals always comprise a weighted average of the LO and xLO signals, which removes the noise source, and therefore, relaxes the propagation delay requirements.

In addition to the advantages provided by the embodiments of FIGS. 1-11, the differential embodiment of FIGS. 12-14 also has the advantage of removing two of the toughest requirements for a capacitive digital-to-RF converter. In particular, the differential action of the conversion unit 120 of FIGS. 12-14 smoothes the power supply signals by using both LO and xLO all the time, and by removing the need for propagation delay matching. These two benefits enables a simpler implementation of the DAC 100 with better performance.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A digital-to-analog upconverter configured to convert a baseband digital value to an RF analog signal, said digital-to-analog upconverter comprising:
   a plurality of conversion units, one for each digital signal of the baseband digital value, each conversion unit configured to generate a weighted analog signal at a low frequency or at a radio frequency responsive to the corresponding input digital signal and an oscillator signal at the radio frequency, wherein a weighting factor of each conversion unit corresponds to a relative weighting of the corresponding input digital signal; and an output node coupled to the conversion units to combine the weighted analog signals output by the conversion units to generate a combined RF analog signal representative of the baseband digital value.

2. The digital-to-analog upconverter of claim 1 wherein each conversion unit comprises:

a logic unit to null the oscillator signal or modulate the oscillator signal responsive to the corresponding input digital signal of the baseband digital value; and a capacitor coupled to the output of the logic unit to weight the nulled oscillator signal or the modulated oscillator signal according to the corresponding relative weighting to generate the weighted analog signal.

3. The digital-to-analog upconverter of claim 1 wherein the baseband digital value represents a binary number having a plurality of bits, and each bit of the binary number has a relative binary weight corresponding to the bit position within the binary number, and wherein the weighting factor of each conversion unit corresponds to the relative binary weight of the corresponding input bit.

4. The digital-to-analog upconverter of claim 1 wherein the baseband digital value represents a thermometer-coded value, and wherein the weighting factors are equal.

5. The digital-to-analog upconverter of claim 1 wherein the digital-to-analog upconverter comprises an I-branch and a Q-branch, wherein the oscillator signal at the radio frequency input to the Q-branch is out of phase with the oscillator signal at the radio frequency input to the I-branch, wherein the plurality of conversion units comprise a first plurality of conversion units and a first node for combining the outputs for the first plurality of conversion units for the I-branch, and a second plurality of conversion units and a second node for combining the outputs for the second plurality of conversion units for the Q-branch, and wherein the output node combines the outputs from the first and second nodes to generate the combined RF analog signal.

6. The digital-to-analog upconverter of claim 1 wherein each conversion unit comprises:

a reference branch configured to output a first weighted signal responsive to a reference signal, the oscillator signal, and the corresponding input digital signal;

a ground branch configured to output a second weighted signal responsive to a ground signal, the oscillator signal, and the corresponding input digital signal;

wherein the first and second weighted signals respectively comprise first and second weighted low frequency signals or first and second weighted radio frequency signals depending on the corresponding input digital signal; and a combiner to combine the first and second weighted signals to generate the weighted analog signal.

7. The digital-to-analog upconverter of claim 6 wherein:
the reference branch comprises:

first and second inverters to respectively generate an inverted reference signal and a first inverted oscillator signal;

a first switch to select the inverted reference signal or the first inverted oscillator signal as a first selected signal responsive to the corresponding input digital signal;

a first set of inverters connected in series to buffer the first selected signal to generate a first buffered signal; and a first capacitor to weight the first buffered signal to generate the first weighted signal; and the ground branch comprises:

third and fourth inverters to respectively generate an inverted ground signal and a second inverted oscillator signal;

a second switch to select the inverted ground signal or the second inverted oscillator signal as a second selected signal responsive to the corresponding input digital signal;

a second set of inverters connected in series to buffer the second selected signal to generate a second buffered signal; and a second capacitor to weight the second buffered signal to generate the second weighted signal.

8. The digital-to-analog upconverter of claim 1 wherein the oscillator signal comprises at least one of a first oscillator signal having the radio frequency and a second oscillator signal comprising an inverted version of the first oscillator signal, and wherein each conversion unit comprises:

a first branch configured to output a first weighted signal responsive to a first reference signal, the first and second oscillator signals, the corresponding input digital signal, and a sign of the baseband digital value;

a second branch configured to output a second weighted signal responsive to a second reference signal, the first and second oscillator signal, the corresponding input digital signal, and the sign of the baseband digital value; and a combiner to combine the first and second weighted signals to generate the weighted analog signal.

9. The digital-to-analog upconverter of claim 8 wherein:
the first branch comprises:

first, second, and third inverters to respectively invert the first reference signal, the first oscillator signal, and the second oscillator signal;

a first switch to select the inverted first reference signal, the inverted first oscillator signal, or the inverted second oscillator signal as the first selected signal responsive to the corresponding input digital signal;

a first set of inverters connected in series to buffer the first selected signal to generate a first buffered signal; and a first capacitor to weight the first buffered signal to generate the first weighted signal; and the second branch comprises:

fourth, fifth, and sixth inverters to respectively invert the second reference signal, the first oscillator signal, and the second oscillator signal;

a second switch to select the inverted second reference signal, the inverted first oscillator signal, or the inverted second oscillator signal as the second selected signal responsive to the corresponding input digital signal;

a second set of inverters connected in series to buffer the second selected signal to generate a second buffered signal; and a second capacitor to weight the second buffered signal to generate the second weighted signal.

10. The digital-to-analog upconverter of claim 8 wherein the first and second selected signals respectively comprise the inverted first and second reference signals, the inverted first signals, or the inverted second signals, and wherein the combiner comprises a combining node.

11. The digital-to-analog upconverter of claim 8 wherein the first and second selected signals respectively comprise the inverted first and second reference signals, the inverted first and second signals, or the inverted second and first signals, and wherein the combiner and output node collectively comprise a balun having a first winding operatively connected between the first and second weighted signals for each conversion unit, and a second winding operatively connected between an output and ground, wherein the output outputs the combined RF analog signal.

12. A method of converting a baseband digital value to an RF analog signal comprising:
   for each digital signal of the baseband digital value, generating a weighted analog signal at a low frequency or at a radio frequency responsive to the corresponding input digital signal and an oscillator signal at the radio frequency, wherein a weighting factor associated with the weighted analog signal corresponds to a relative weighting of the corresponding input digital signal; and
   combining the weighted analog signals to generate a combined RF analog signal representative of the baseband digital value.

13. The method of claim 12 wherein generating each weighted analog signal comprises:
   nulling or modulating the oscillator signal responsive to the corresponding input digital signal of the baseband digital value; and
   weighting the nulled oscillator signal or the modulated oscillator signal according to the corresponding relative weighting to generate the weighted analog signal.

14. The method of claim 12 wherein the baseband digital value represents a binary number having a plurality of bits, and each bit of the binary number has a relative binary weight corresponding to the bit position within the binary number, and wherein the weighting factor of associated with each weighted analog signal corresponds to the relative binary weight of the corresponding bit.

15. The method of claim 12 wherein the baseband digital value represents a thermometer-coded value, and wherein the weighting factors are equal.

16. The method of claim 12 wherein the baseband digital value comprises an In-phase digital value having a plurality of In-phase digital signals and a Quadrature digital value having a plurality of Quadrature digital signals, wherein the oscillator signal at the radio frequency input to a Q-branch is out of phase with the oscillator signal at the radio frequency input to an I-branch, wherein generating the weighted analog signal comprises generating an In-phase weighted analog signal for each of the In-phase digital signals and generating a Quadrature weighted analog signal for each of the Quadrature digital signals, and wherein combining the weighted analog signals comprises combining the In-phase weighted analog signals to generate a combined In-phase RF signal, combining the Quadrature weighted analog signals to generate a combined Quadrature RF signal, and combining the In-phase and Quadrature RF signals to generate the combined RF analog signal.

17. The method of claim 12 wherein generating the weighted analog signal for each digital signal comprises:
   generating a first weighted signal responsive to a reference signal, the oscillator signal, and the corresponding digital signal;
   generating a second weighted signal responsive to a ground signal, the oscillator signal, and the corresponding digital signal;
   wherein the first and second weighted signals respectively comprise first and second weighted low frequency signals or first and second weighted radio frequency signals depending on the corresponding digital signal; and
   combining the first and second weighted signals to generate the weighted analog signal.

18. The method of claim 12 wherein the oscillator signal comprises at least one of a first oscillator signal having the radio frequency and a second oscillator signal comprising an inverted version of the first oscillator signal, and wherein generating each weighted analog signal comprises:
   generating a first weighted signal responsive to a first reference signal, the first and second oscillator signals, the corresponding digital signal, and a sign of the baseband digital value;
   generating a second weighted signal responsive to a second reference signal, the first and second oscillator signal, the corresponding digital signal, and the sign of the baseband digital value; and
   combining the first and second weighted signals to generate the weighted analog signal.

19. The method of claim 18 wherein the first and second selected signals respectively comprise the inverted first and second reference signals, the inverted first signals, or the inverted second signals, and wherein combining the first and second weighted signals comprises combining the first and second weighted signals in a combining node to generate the weighted analog signal.

20. The method of claim 18 wherein the first and second selected signals respectively comprise the inverted first and second reference signals, the inverted first and second signals, or the inverted second and first signals, and wherein combining the first and second weighted signals comprises combining the first and second weighted signals for each conversion unit in a balun having a first winding operatively connected between the first and second weighted signals, and a second winding operatively connected between an output and ground, wherein the output outputs the combined RF analog signal.

* * * * *

UNITED STATES PATENT AND TRADEMARK OFFICE
CERTIFICATE OF CORRECTION

PATENT NO. : 8,451,157 B2  
APPLICATION NO. : 13/076717  
DATED : May 28, 2013  
INVENTOR(S) : Vilhonen et al.

Page 1 of 1

It is certified that error appears in the above-identified patent and that said Letters Patent is hereby corrected as shown below:

On the Title Page, in Item (75), under "Inventors", in Column 1, Line 1, delete "Sami" and insert -- Sami Tapani --, therefor.

On the Title Page, in Item (56), under "OTHER PUBLICATIONS", in Column 2, Line 1, delete "EER/Plar" and insert -- EER/Polar --, therefor.

On the Title Page, in Item (56), under "OTHER PUBLICATIONS", in Column 2, Line 5, delete "OdBm" and insert -- 0dBm --, therefor.

In The Drawings

In Fig. 2, Sheet 1 of 11, delete " " and insert -- 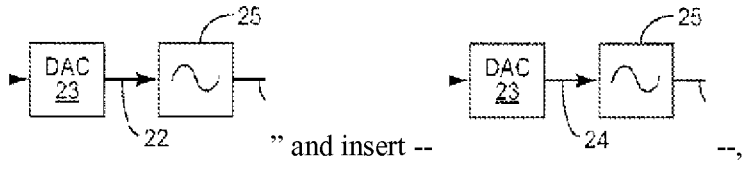 --, therefor.

In The Specification

In Column 1, Lines 30-31, delete "Complimentary" and insert -- Complementary --, therefor.

In Column 10, Line 50, delete "DAC 100" and insert -- DAC 110 --, therefor.

In The Claims

In Column 13, Line 29, in Claim 14, delete "factor of" and insert -- factor --, therefor.

Signed and Sealed this  
Nineteenth Day of April, 2016

Michelle K. Lee  
*Director of the United States Patent and Trademark Office*